US011640805B2

(12) United States Patent
Reckwerdt, Jr.

(10) Patent No.: US 11,640,805 B2
(45) Date of Patent: May 2, 2023

(54) IMAGE PROCESSING SYSTEM CREATING A FIELD SEQUENTIAL COLOR USING DELTA SIGMA PULSE DENSITY MODULATION FOR A DIGITAL DISPLAY

(71) Applicant: Wilbur Arthur Reckwerdt, Jr., Saratoga, CA (US)

(72) Inventor: Wilbur Arthur Reckwerdt, Jr., Saratoga, CA (US)

( * ) Notice: Subject to any disclaimer, the term of this patent is extended or adjusted under 35 U.S.C. 154(b) by 0 days.

(21) Appl. No.: 17/485,487

(22) Filed: Sep. 26, 2021

(65) Prior Publication Data

US 2023/0097456 A1 Mar. 30, 2023

(51) Int. Cl.

*G09G 5/10* (2006.01)
*H03M 3/00* (2006.01)
*G09G 3/36* (2006.01)

(52) U.S. Cl.

CPC ... *G09G 3/3611* (2013.01); *G09G 2310/0235* (2013.01); *G09G 2320/066* (2013.01); *G09G 2320/0626* (2013.01); *G09G 2330/021* (2013.01); *G09G 2340/04* (2013.01)

(58) Field of Classification Search

CPC .. H04N 5/14; H04N 5/21; H04N 5/91; H04N 19/40; H04N 19/172; H04N 19/182; H04N 19/192; H04N 19/184; H04N 19/74; H04N 7/01; G09G 3/20; G09G 3/3611; G09G 5/10; G09G 5/14; G09G 5/18; G09G 2310/0235; G09G 2320/0626; G09G 2320/066; G09G 2330/021; G09G 2340/04; H03M 3/00; H03M 3/02; H03M 1/18; H04L 25/49

See application file for complete search history.

(56) References Cited

U.S. PATENT DOCUMENTS

| | | | | |
|---|---|---|---|---|
| 2002/0118304 A1* | 8/2002 | Mandi | G09G 5/363 | 348/671 |
| 2006/0097978 A1* | 5/2006 | Ng | G09G 3/3413 | 345/207 |
| 2009/0201418 A1* | 8/2009 | Endo | H04N 9/3111 | 348/453 |
| 2012/0242600 A1* | 9/2012 | Chiou | G06F 3/0412 | 345/173 |
| 2014/0240642 A1* | 8/2014 | Furukawa | H05B 45/20 | 349/65 |
| 2015/0015147 A1* | 1/2015 | Knapp | G09G 3/3426 | 315/158 |

(Continued)

*Primary Examiner* — Chanh D Nguyen
*Assistant Examiner* — Nguyen H Truong
(74) *Attorney, Agent, or Firm* — Bayramoglu Law Offices LLC

(57) ABSTRACT

A device and method of an image processing system where a Field Sequential Color Delta Sigma Pulse Density Modulation is used for digital displays, where the digital displays are non-emissive. The device and method are a digital driving solution using Delta Sigma Encoding where N bit-per-component symbols at F1 frame-rate-per-second are represented using M bits-per-component symbols at F2 frame-rate-per-second, where N≥M and F2≥F1. The F2 frames are sent to a sequential color picker, which outputs frames with one color, followed by the next in a sequential pattern which reduces power consumption, increases color saturation, increases contrast, and increases brightness.

11 Claims, 16 Drawing Sheets

(56) References Cited

U.S. PATENT DOCUMENTS

| | | | | |
|---|---|---|---|---|
| 2018/0350288 | A1* | 12/2018 | Koizumi | G09G 3/36 |
| 2019/0122637 | A1* | 4/2019 | Sanders | G06F 3/147 |
| 2021/0409742 | A1* | 12/2021 | Lee | H04N 19/184 |

* cited by examiner

IMAGE PROCESSING SYSTEM CREATING A FIELD SEQUENTIAL COLOR USING DELTA SIGMA PULSE DENSITY MODULATION FOR A DIGITAL DISPLAY

TECHNICAL FIELD

The present disclosure relates to an image processing system and method thereof creating a Field Sequential Color (FSC) using Delta Sigma (ΔΣ) Pulse Density Modulation (PDM). More particularly, an image processing system and method used in digital displays.

BACKGROUND

Display technology has become ubiquitous in our daily life. Applications include smartphones, tablets, laptops, monitors, televisions (TVs), Augmented Reality (AR) and Virtual Reality (VR) head-mounted display (HMD)s and signage. As these technologies grow, the amount and percentage of your household energy budget that they consume grows. Energy efficiency needs to become better if the world's economies are to meet their climate change abatement targets while continuing to grow.

Liquid Crystal Displays (LCDs) were invented in the 1960s and are non-emissive; meaning that they require a backlight unit (BLU). Organic Light Emitting Diodes (OLEDs) have emerged due to their thinness and black levels. MicroLEDs (μLEDs) and miniLEDs (mLEDs) are the newest contenders. With mLEDs, normally, acting as a backlight source for LCDs and μLED competing in small devices like VR/AR HMDs.

An emissive display converts electrical energy into light. Each pixel emits light and each pixel turns on/off individually. Emissive displays are distinguished by a deep black level, high contrast and fast response time. The primary emissive display method is an OLED (shown in FIG. 1), which is used in smartphones, tablets, laptops and televisions, but there are others such as μLED and Plasma.

OLEDs have some technical issues:

1) OLEDs consist of complex multilayer thin film stacks with stringent requirements on material purity and stability.
2) The manufacturing process is a complicated vacuum process, which requires thickness controls.
3) OLEDs are current driven devices which require 3-6 thin film transistors (TFTs) per pixel to ensure stabile current controls. The TFTs block light thus reducing the aperture ratio.
4) OLEDs require a circular polarizer to block the ambient light reflection off of their metallic control structure (cathode and anode).

OLED's are difficult to manufacture and suffer from color balance and uniformity issues especially for the color blue. Non-uniformity is where adjacent pixels look different and therefore uniformity means having adjacent pixels look the same. Many techniques have been proposed to address the color balance issue which include using white OLEDs with a color filter as shown in FIG. 2 and making the blue and red OLED material larger than the green. White OLED with a color filter has an efficiency of 40% per filter. Making the material different sizes is difficult to control during manufacturing, which increases the non-uniformity.

A non-emissive display, which is sometimes called transmissive, reflective or passive, uses optics to bend light (they are collectively termed spatial light modulators). A light source such as a light-emitting diode (LED), mLED or sunlight is bent. The primary non-emissive display is a Liquid Crystal Display (LCD), which is used in automotive, TVs, and signage, but there are others like digital light processing (DLP) or liquid crystal on silicon (LCoS). The device structure is bulkier, but it is modular, which allows it to be easily manufactured and each module can advance separately. LCD's are easy to manufacture, but cannot produce true black, suffer from color inversion (i.e. poor viewing angle) and are not efficient. A typical LCD is shown in FIG. 3. These displays emit between 4%-8% of the backlight energy making them very inefficient. The polarizer blocks 50% of the light; the color filters block another 60% of the light (allowing red, green, or blue colors through one at a time); and a thin-film transistor (TFT) active array blocks 50% of the light. LCDs are leading in lifetime, power consumption, resolution, comparable ambient contrast ratio, and viewing angle. LCD continue to dominate because small step improvements in each module are accumulating to noticeable differences.

Thus, there is a present need for a non-emissive display technology, which produces bright, clear and colorful images while increasing efficiency. For smartphones and tablets, low power consumption leads to a longer battery life. For large screen TVs, Computer Display, Energy Commissions—like Energy Star in the US—set the power regulations. The present disclosure and invention take a novel approach of using a Field Sequential Color (FSC) coding methodology and applying a Delta Sigma (ΔΣ) Pulse Density Modulation (PDM) circuit which solves the problems mentioned above. The FSC ΔΣ PDM builds an image over time, is frameless, and has no spatial properties. In FSC ΔΣ PDM color mixing, a display presents to the observer several mono-colored frames in sequence, which are then perceived to be a single full color frame. The human eye uses temporal integration to blend as shown in FIG. 8.

SUMMARY

The present disclosure is an image processing system and a method implemented in a display driver. Using modulation and backlight controls, the display changes the way that videos and/or images are displayed by using Field Sequential Color (FSC) Delta Sigma (ΔΣ) Pulse Density Modulation (PDM). An incoming video/image of N-bits at a video harmonic rate of F1 is converted to M-bits at the display rate of F2 where N≥M and F2≥F1. The F2 frames are sent to a sequential color picker, which outputs frames with one color, followed by the next in a sequential pattern. The advantages of this approach are reduction in power consumption, increased color saturation, increased contrast, and increased brightness.

A visual artifact called "color breakup" (CBU) has been a recurring concern with FSC displays and is commonly viewed as a rainbow appearing in the video. Color breakup is the imperfect overlap of frames on the retina caused by a difference in the relative velocity between displayed objects and an observer's eyes; for example, saccadic eye movements or smooth pursuits of moving objects. The color breakup issue reduces as the frame rate increases. The slower the update rate, the more prevalent is CBU. The disclosed invention has solved the color breakup problem and has eliminated CBU by performing ΔΣ PDM.

An FSC algorithm uses a Delta-Sigma Pulse Density Modulation (ΔΣ PDM). The original video/image is inputted. The FSC algorithm breaks the video/image down into subpixels. Each subpixel is then run through the FSC algorithm as shown in FIG. 6. The modulation results in a full color representation. A sequential color picker segments the frames into a Red, Green, or Blue (see FIG. 8). This approach updates the motion at the display's frame rate regardless of which color is being drawn. Color breakup has not been witnessed at or above 180 Hz.

LCD panels have internal row and column drivers, much like DRAM. Row drivers activate the rows of the display, while column drivers set the required voltage on all of the dots in the activated row and thus supplies voltages to the LCD panel. An LCD panel comprises a matrix of pixels, divided into for example, red, green, and blue "sub-pixels". FIG. 14, sets the required voltage of the pixels in the activated row and thus supplies voltages to the LCD panel. An LCD panel comprises a matrix of pixels, divided into for example, red, green, and blue "sub-pixels", see FIG. 15.

The invention and disclosure introduce a way to achieve FSC using a massively parallel FSC algorithm. The FSC algorithm allows for a massively parallel architecture to be built. This is because no pixel is related to any other pixel within the same frame. The term frame here would mean 1080P or 4K or something equivalent. The FSC algorithm converts every subpixel using the following formula:

New_Value=Input_Video/Image_Value+Residual_Value;

Output_Video/Image=NearestValueEqualorUnder

Residual_Value=New_Value−Output_Video/Image.

Note: Output_Video/Image is a normalized floating-point number between 0 and 1. Output_Video/Image corresponds to the value M. The values are spread equally between 0 and 1 in increments of $2^M-1$.

Example: If M=2 (2 bit-depth video), the increments are divided by 3.

The Output_Video/Image is one of {0, ⅓, ⅔, 1.0}. If M=3 (3-bit depth video output), then the values are divided by 7 {0, 1/7, 2/7, 3/7, 4/7, 5/7, 6/7, 1.0}.

FSC changes the mono-colored Backlight Unit (BLU) to individual colored BLU. The new BLU normally uses RGB LEDs, but other diodes and/or functionally equivalent elements/devices are possible to be used. The system illuminates the Red (R) followed by Green (G) followed by Blue (B). The order of the color is not important. A typical LED/LCD stack is shown in FIG. 3. The normal mono-color (typically White) BLU is replaced by a multi-color (typically RGB) BLU and the Color Filters (CF) are removed/no present in FIG. 5. Each CF reduces the LED efficiency by 40% (power is consumed/burned). Since there are three CF (R, G, and B), the efficiency gain by removing the CF are (3/0.40=) 7.5×. In addition to this power savings, the BLU may illuminate only for the horizontal array associated with the rows being processed by the LCD (see FIG. 10). The idea is if the screen was divided into 3 sets of 3 zones (FIG. 10 shows 9 lines). Then 3 lines are on. The other 6 are off. This is called backlight scan mode and is present on existing backlight drivers. The LCD bends light to turn the LCD off or on. The typical power consumption is shown in FIG. 4.

Running the FSC algorithm increases the aperture ratio by 3×. Only the Red or Green or Blue BLU illuminates on each frame. When not using FSC, one has to illuminate the Red, Green, and Blue pixel in succession leading to the need for 3 column drivers, one for each color. This invention uses FSC and therefore only one column driver is need because Red or Green or Blue is shown per frame and therefore this reduces the column drivers by ⅔. Moreover, this reduction in the number of column drivers also has a big advantage in that the pixels per inch (PPI) increases by 3× and the contrast is improved because of scattering off of the column drivers, which are made of metal, is reduced (as shown in FIG. 12). The individual LEDs can have a steep curve, which increases the saturation (see FIG. 9). The BLUE LED(s) can move away from the eye toxicity area (between 415-455 nm). The total effect is that that the brightness increases by 7.5×, the contrast increases by up to 3×, the Pixel Per Inch (PPI) increases by 3×, and the color is more saturated. To produce equivalent quality images, Table 1 shows the display frame rates versus incoming bit-depth. For example, the FSC algorithm needs 7 bits per component (bpc) i.e. 7-bpc on a 300 Hz monitor to modulate a High Dynamic Range (HDR10) incoming video. Note: fps is an acronym for frames per second.

TABLE 1

N versus M at various FSC frame rates

| F1 = 30 fps/N | F2 = 180 fps/M | F2 = 240 fps/M | F2 = 300 fps/M | F2 = 360 fps/M |
|---|---|---|---|---|
| 6-bpc | 5-bpc | 4-bpc | 3-bpc | 2-bpc |
| 8-bpc | 7-bpc | 6-bpc | 5-bpc | 4-bpc |
| 10-bpc | 9-bpc | 8-bpc | 7-bpc | 6-bpc |

Making displays run faster is desired to reduce eye fatigue and to sell to the gaming markets. Delta Sigma PDM requires less time to resolve the least significant bit (LSB) when compared to Pulse width modulation (PWM). The system has to meet the human eyes integration time, which is 0.6 seconds. This translates into 420 fps to resolve N=8-bpc using M=1-bpc (Refer to Table 2).

TABLE 2

Time to resolve the LSB

| N | Resolve LSB PWM | Resolve LSB Delta Sigma PDM |
|---|---|---|
| 8-bpc, 1080P@120 Hz | 30 ns | 1150 ns |
| 10-bpc 1080P@120 Hz | 7.5 ns | 290 ns |

BRIEF DESCRIPTION OF THE DRAWINGS

In order to more clearly illustrate the embodiments of the present disclosure, a brief description of the drawings is given below. The following drawings are only illustrative of some of the embodiments of the present disclosure and for a person of ordinary skill in the art, other drawings or embodiments may be obtained from these drawings without an inventive effort.

DETAILED DESCRIPTION

Figure 1:
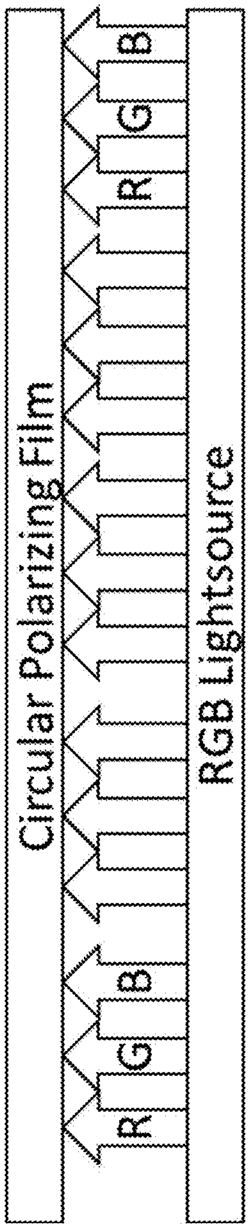
FIG. 1 (Prior Art)
FIG. 1 illustrates a typical stack for RGB OLEDs without color filters.

The technical solutions of the present disclosure will be clearly and completely described below with reference to the drawings. The embodiments described are only some of the embodiments of the present disclosure, rather than all of the embodiments. All other embodiments that are obtained by a person of ordinary skill in the art on the basis of the embodiments of the present disclosure without an inventive effort shall be covered by the protective scope of the present disclosure.

In the description of the present disclosure, it is to be noted that the orientational or positional relation denoted by the terms such as "center", "upper", "lower", "left", "right", "vertical", "horizontal", "inner" and "outer" is based on the orientation or position relationship indicated by the figures, which only serves to facilitate describing the present disclosure and simplify the description, rather than indicating or suggesting that the device or element referred to must have a particular orientation, or is constructed or operated in a particular orientation, and therefore cannot be construed as a limitation on the present disclosure. In addition, the terms "first", "second" and "third" merely serve the purpose of description and should not be understood as an indication or implication of relative importance.

In the description of the present disclosure, it should be noted that unless otherwise explicitly specified and defined, the terms "install", "link" and "connect" shall be understood in the broadest sense, which may, for example, refer to fixed connection, detachable connection or integral connection; may refer to mechanical connection or electrical connection; may refer to direct connection or indirect connection by means of an intermediate medium; and may refer to communication between two elements. A person of ordinary skill in the art would understand the specific meaning of the terms in the present disclosure according to the specific situations.

The invention is an image processing system or method implemented within a display driver and is a novel way to display images, whether the image(s)/video(s) is/are still or moving. As the modulation scheme within the image processing system, the invention produces a Field Sequential Color (FSC) using Delta Sigma (ΔΣ) Pulse Density Modulation (PDM). The system uses ΔΣ PDM and oversamples the input therefore, breaking the input into digital components (see FIG. 7). The output frequency must be greater than or equal to the input harmonic frequency. The digital components can be represented using 1-bit, 2-bits, 3-bits and so on and this is known as the bit-depth. The sequential color picker outputs red, green, or blue frames (see FIG. 8) which are integrated by the eye. Using ΔΣ PDM, the images are created over time and the human eye (or a camera) integrates them. For each subpixel, a loop of summations is created running at the output frequency. A subpixel value is added to the residual from the previous iteration of the loop using the following formula:

New_Value=Input_Video/Image_Value+Residual_Value;

Output_Video/Image=NearestValueEqualorUnder

Residual_Value=New_Value−Output_Video/Image.

As an example, if the initial Residual_Value=0 and the Input_Video/Image_Value=0.89 (0 1 scale), then the New_Value=0.89+0=0.89. If M=2, the four possible values are 0, ⅓, ⅔, 1.0. Therefore, the Output_Video/Image=0.67 (Nearest Value that is equal or under is ⅔). The Residual=0.89−0.67=0.22. On the next frame, if the Input_Video/Image_Value does not change, then the New_Value=0.89+0.22=1.11. Thus, the Output_Video/Image=1.0 and the Residual=1.11−1.0=0.11. Thus, the residual value is saved, and the residual value will be used on the next frame at the same pixel location. The next frame will occur at time increments of F1. F2/F1 will define how many Outputs occur for the Input.

A series of shifters and adders are implemented by using different technologies. For example, using a semiconductor-based technology (see FIG. 7), each subpixel can be operated on independently. The end result is a massively parallel architecture.

The ΔΣ PDM output is not an image. In fact, the output has no frame properties; the ΔΣ PDM output is frame-less (see FIG. 6 and FIG. 7). The output after the eye integrates is an image (see FIG. 8). The image quality produced by FSC ΔΣ PDM depends on oversampling frequency and the bit-depth of the digital component (refer to Table 1). As the bit-depth decreases, the oversampling frequency must increase to produce equivalent images/videos.

Since the human eye is the integrator, the image must be resolved within the human eye integration time which is 0.6 seconds. This makes ΔΣ PDM faster than PWM (refer to Table 2). The advantages of this approach are reduced power consumption, increased color saturation, increased brightness, increased contrast, and increased PPI.

Definition of Terms

Dithering hides banding by noisily transitioning from one color to another. This does not increase the bits-per-component.

Pixel is a point within the image. A pixel is made up of three or four components such as red, green, and blue (RGB), or cyan, magenta, yellow, and black (CMYK). Components are also referred to as sub-pixels/subpixels. Throughout this document we refer to bits-per-component (bpc), which is also known as bits per subpixel.

The present invention, which discloses a system and method thereof creating a Field Sequential Color (FSC) using Delta Sigma (ΔΣ) Pulse Density Modulation (PDM) for digital displays, is described in detail below in reference to the figures.

Figure 2:
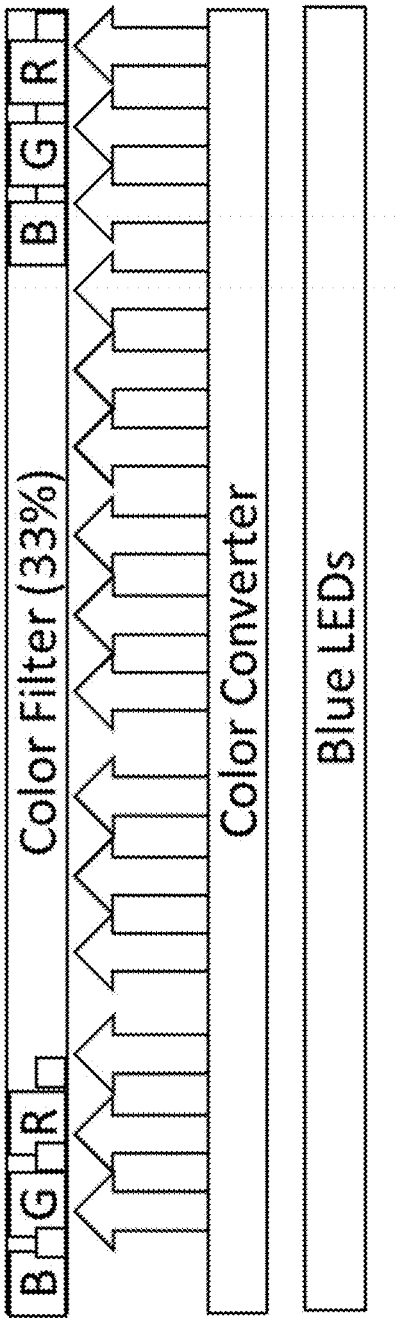
FIG. 2 (Prior Art)
FIG. 2 illustrates a typical stack for a White OLED with color filters.
Figure 3:
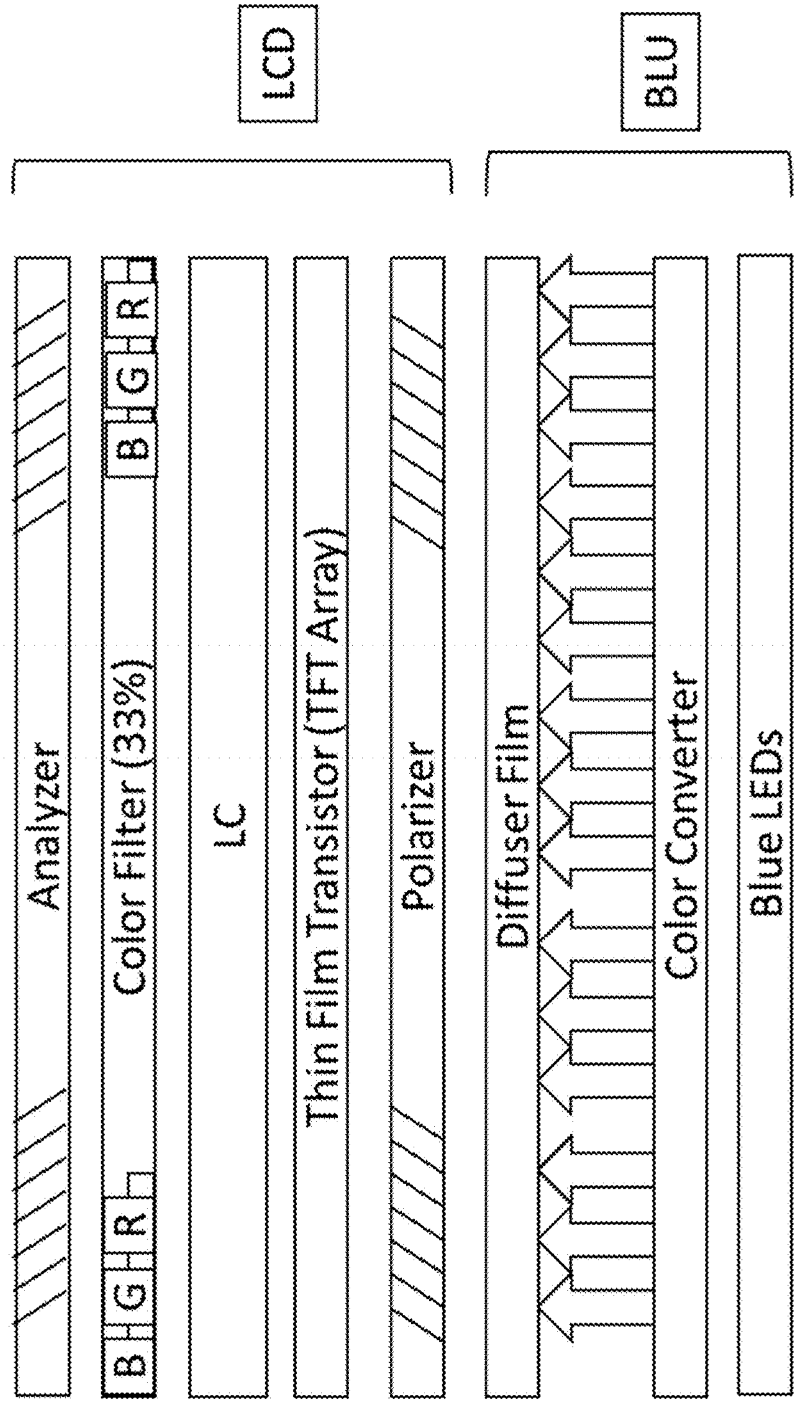
FIG. 3 (Prior Art)
FIG. 3 illustrates a typical stack for LCD with color filters.
Figure 4:
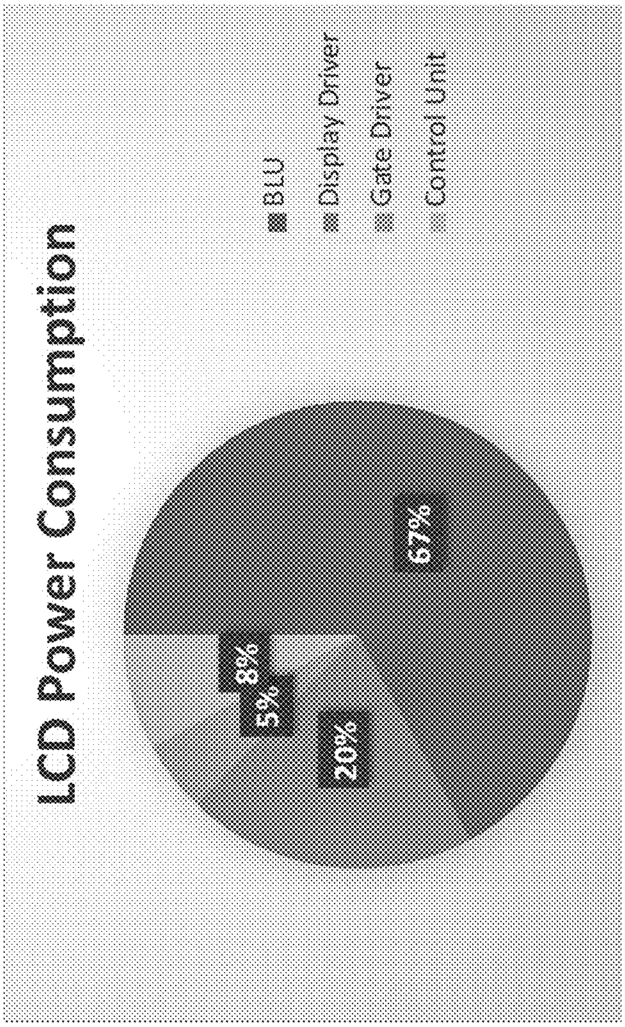
FIG. 4 (Prior Art)
FIG. 4 illustrates a typical power consumption for LCD with color filter components.
Figure 5:
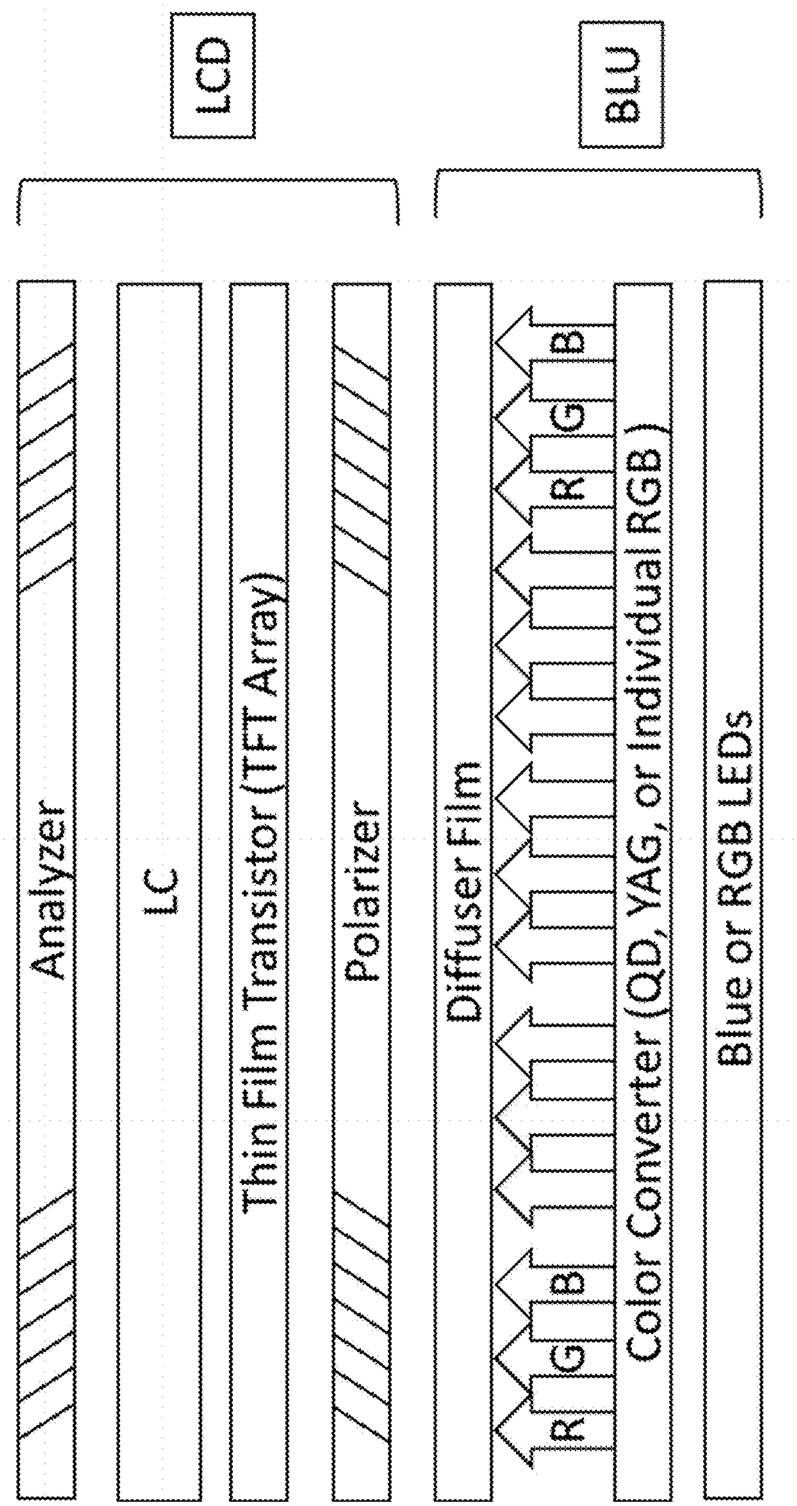
FIG. 5 illustrates an FSC stack for LCD without (i.e. devoid of) color filters.

FIGS. 1-2 illustrate the typical stack for an emissive display (OLED). FIG. 3 illustrates the typical stack for a non-emissive display (LCD). FIG. 4 illustrates the typical power consumption of an LCD with a color filter. FIG. 5 illustrates an FSC stack for LCD without color filters of applicant's invention. FIGS. 6-12 illustrate details of applicant's invention, where a detailed description will be proved below. FIG. 13 shows a traditional ΔΣ block diagram used when making audio compact discs (CD).

FIG. 1 illustrates a typical stack for RGB OLEDs without color filters. This stack is difficult to manufacture and suffers from color uniformity issues, mainly due to the blue color. Blue has a shorter life span than the other colors.

FIG. 2 illustrates a typical stack for a White OLED with color filters which is easier to manufacture, but the color filters are 40% efficient, which means that they block the light intensity.

FIG. 3 illustrates a typical stack for LCD with color filters. Generally, 4-8% of the light from the light source gets through the stack. Most of the power is consumed going through the color filters. The color filters are 40% efficient, which means that they block the light intensity. To compensate, the BLU must increase the intensity, which increases the power requirements.

FIG. 4 illustrates a typical power consumption for LCD with color filters. Most of the power is consumed by the backlight unit (BLU). The backlight unit (BLU) takes 67% of the power budget.

FIG. 5 illustrates an LCD without color filters. 87% of the BLU power will be saved by removing the color filters. The total power savings will be 87%*67%=58%. Thus, since the disclosed LCD and/or the FSC stack for the LCD, as shown in FIG. 5, is devoid of any color filter, 87% of the BLU power will be saved and the total power savings will be 87%*67%=58%.

The LCD comprises an analyzer; a liquid-crystal (LC); a thin film transistor (TFT) array; and a polarizer. The backlight unit (BLU) comprises a diffuser film; a color converter, which can be a quantum dot (QD) color converter or any equivalent color converter; and at least one blue LED or there are a plurality of blue LED's.

Figure 6:
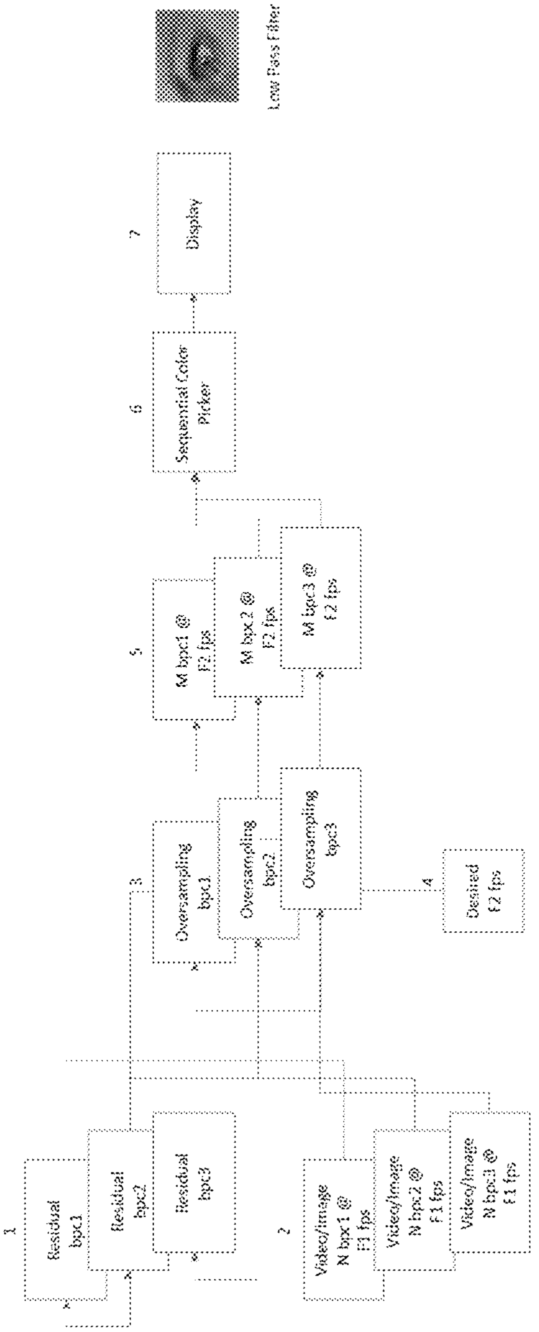
FIG. 6 is a diagram showing components of the image processing system and particularly showing per component delta sigma FSC modulation flow.

FIG. 6 is the system used in this invention. As shown in FIG. 6, the video/image 2 is inputted into the system. The inputted video/image 2 can be any (N) bit-per-component (bpc) at any F1 frame rate per second (fps). Each pixel location in the video/image has a value. The output will be at a new value using M-bpc at F2 fps. The ratio of F2/F1 is the oversampling frequency. As the oversampling frequency increases, fewer bits-per-component (M) are needed to display the video. The temporal average of the M-bpc values at the oversampling frequency represent the N-bpc value. A display 7 is made from Emissive or Non-Emissive material. Then a backplane consisting of thin-film transistors drive the display. A Timing Control or Application Processor (AP) decides which transistors are on or off. The FSC algorithm is inside the Timing Controller or AP. FSC reduces the number of columns (number of transistors) and thus the PPI increases.

When comparing the present invention to a traditional ΔΣ block diagram of FIG. 13, input 1 is the video input; an impulse is the Residual. Counter is the Oversampling output. Summing Interval is M-bpc at F2. Buffer is a low pass filter (the human eye or camera).

FIG. 6 is described in more detail below.

Reference number 1 is a residual from the previous iteration. The first iteration is pre-defined. A good first-order approximation of the residual is a distribution of a random number across the image. The residual is divided into its color components. The color components can be any color space such as RGB (Red-Green-Blue) or CMYK (Cyan-Magenta-Yellow-black). These color components are often termed sub-pixels/subpixels.

Reference number 2 is a video/image. The video is also divided into its color components. The video can be inputted at any frame rate F1 (0=still image; 15 fps, 24 fps, etc.).

Reference number 3 is an oversampling module. The oversampling module 3 can be software (i.e. code or algorithm) and/or hardware such as a chip, an application processor (AP) and/or a timing controller (TCON). The oversampling module 3 can be implemented in many different ways depending on the underlying hardware. A common way is to use an N-bpc adder. Box 1 is added to Box 2 for each component. If the summation overflows the N-bpc adder, then the output value is incremented. For example, if M=1, the video input is 81 (0–255 range), the residual from the previous frame is 200 (0-255 range), then the summation=281 (0–255 range). This creates an overflow; output value=1 and the residual for the next iteration=26. The output value, defined in M-bpc, does not define a color level per frame. ΔΣ PDM is frameless. Instead, the M-bpc values are integrated over time by the eye to form the image. The M-bpc values averaged over the oversampling frequency will approximate the original input video at N-bpc. They will be equivalent if the oversampling frequency is high enough as show in Table 1.

Reference number 4 is a module providing the desired F2 fps. The module 4 can be software (i.e. code or algorithm) and/or hardware such as a chip, an application processor (AP) and/or a timing controller (TCON). F2 is nominally set to the display's frequency and M is set to achieve the desired goal. The goal may be equivalency, bandwidth reduction, power reduction, or Mura (i.e. lack of uniformity) correction.

Reference number 5 is an output value in M-bpc. In the above example, the value=1.

Reference number 6 is a Sequential Color Picker. In an example, the sequential color picker chooses among Red, Green or Blue. When the sequential color picker chooses Red, the sequential color picker Nulls (zeros) all information about Green and Blue.

Reference number 7 is an output to the display that will show the value M.

A low pass filter which will integrate the output values over time. Nominally, this is a human eye. The low pass filter can alternatively be a camera running at the input frequency (F1) or alternatively any device that performs a low pass filter function.

Figure 7:
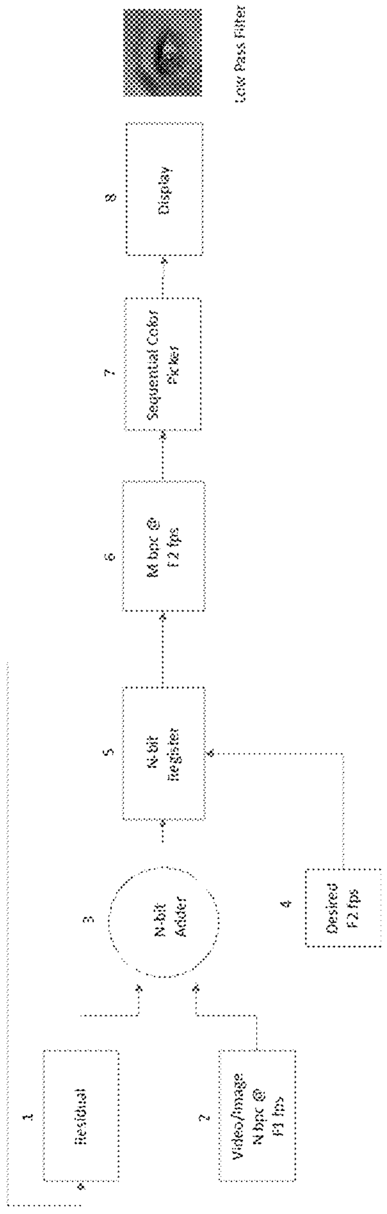
FIG. 7 is the diagram showing the oversampler implemented as an N-bit adder.

FIG. 7 illustrates the oversampling built using an N-bit adder (3). The description is the same as FIG. 6. In addition, an N-bit adder (3) is where the Sum=Input+Residual and an N-bit-register is 0, 0.33, 0.67, 1.0.

Figure 8:
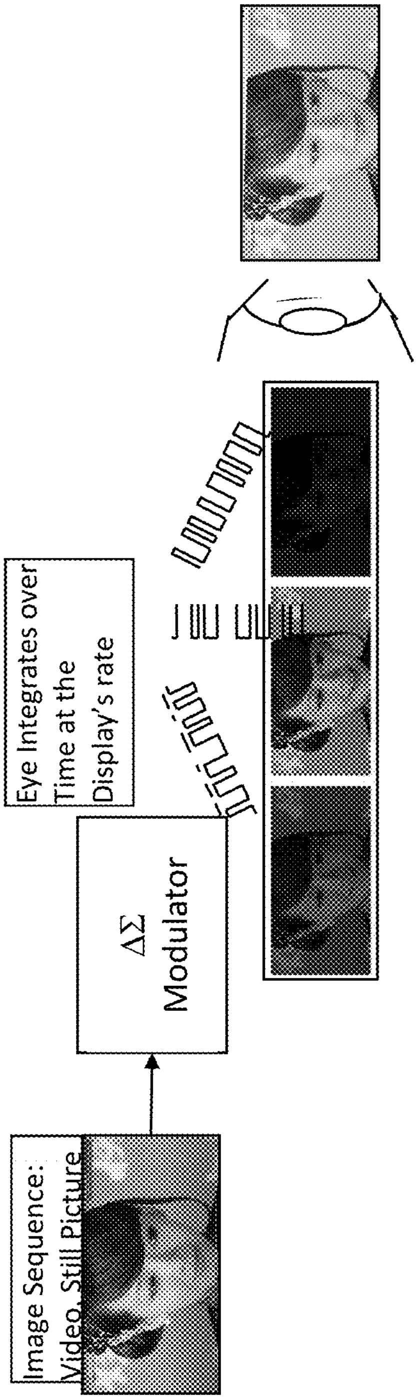
FIG. 8 illustrates three RGB frames integrated by the eye.

FIG. 8 illustrates the final data as a Red, Green, or Blue only Frame. This can be also CMYK or any other color space. FIG. 8 is illustrating an output after all of the calculations are performed and is showing output values as a red, green, or blue frame.

Figure 9:
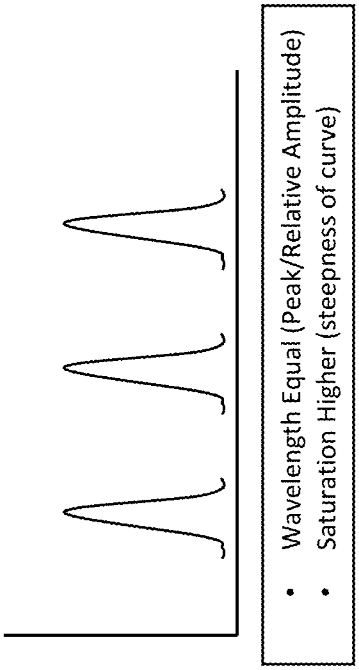
FIG. 9 illustrates that the individual multi-color (typically RGB) BLU can be steep which increases the color saturation and the Blue wavelength can move to be greater than 455 nm.

FIG. 9 illustrates that individual LEDs will make up the backlight and is showing how to make the display saturated (i.e. very colorful). The X-axis is in nm and illustrates that the Red Color or Blue Color or Green Color can be very thin (saturated). The Y axis is the brightness of the LEDs. These LEDs can be made very steep which has two affects: the color saturation will improve, and the Blue LED(s) wavelength can be moved to be greater than 455 nm (Blue light ratio between 415-455 nm has been shown to be harmful in some studies). In order to reduce the blue light toxicity factor, the industry has used a blue reduction filter. However, the blue reduction filter removes 20% of the brightness of the display. This invention has solved the blue light toxicity by moving the Blue LED to greater than (i.e. >) 455 nm, while also improving the color saturation and improving the brightness of the display.

Figure 10:
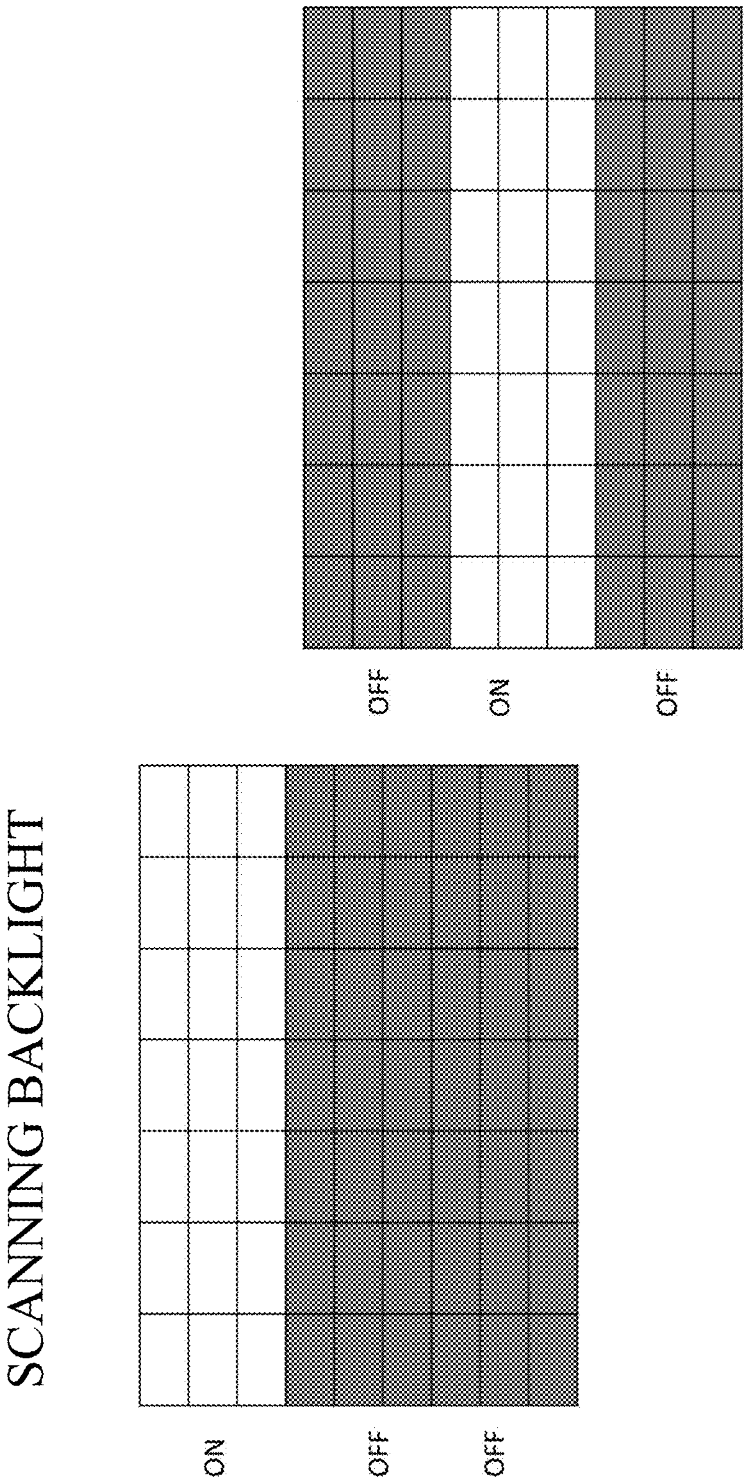
FIG. 10 illustrates that the BLU can be scanned which will decrease the power further.

FIG. 10 illustrates that the BLU can be scanned and is showing how scanning the backlight will reduce motion blur. This will save power as the backlight does not need to be on for the entire frame. Motion blur can be improved using scanned backlights Backlight is divided into rows Light is scanned down the display at frame rate One or more rows can be illuminated at a time This removes the blur effect.

Figure 11:
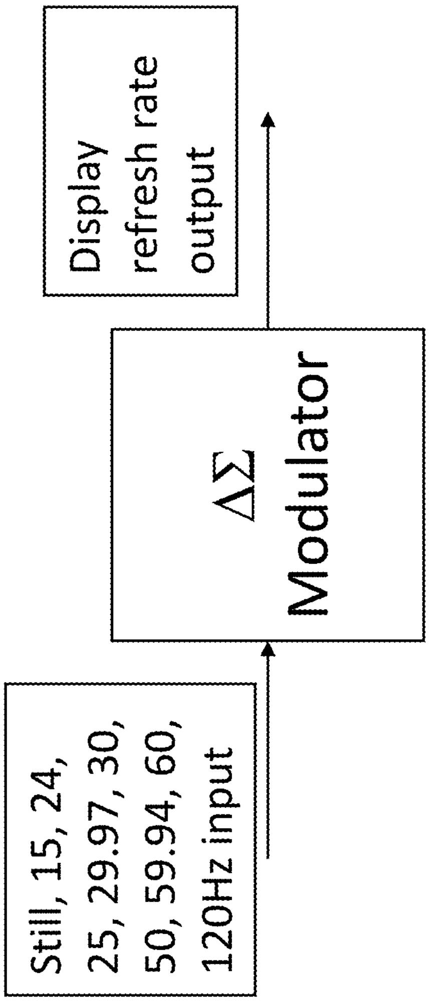
FIG. 11 illustrates that Delta Sigma PDM is asynchronous input to output.

FIG. 11 illustrates the asynchronous input to output of the FSC Delta Sigma PDM. A video is inputted at a given frame rate. After FSC ΔΣ PDM, the output is asynchronous from the input.

Figure 12A:
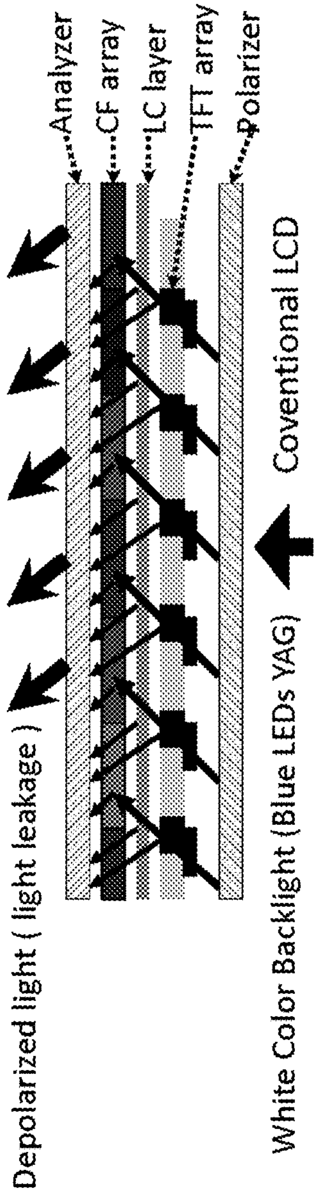
FIG. 12A (Prior Art)
FIG. 12A illustrates a conventional LCD and how scattering occurs off the column drivers and color filters.
Figure 13:
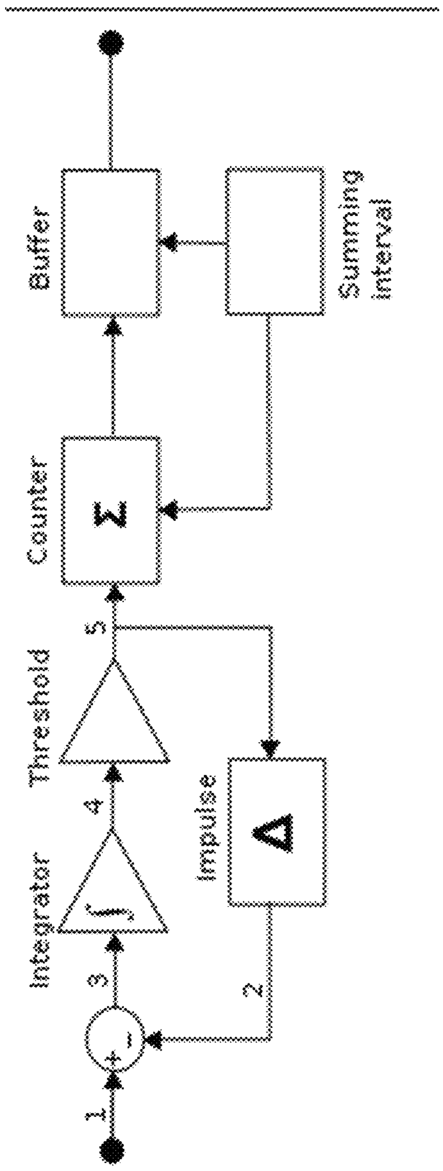
FIG. 13 (Prior Art)
FIG. 13 illustrates a typical Delta Sigma digital circuit used for compact disc (CD) audios.

FIG. 12A illustrates scattering within a conventional LCD. The backlight scatters off the column drivers and color filters.

Figure 12B:
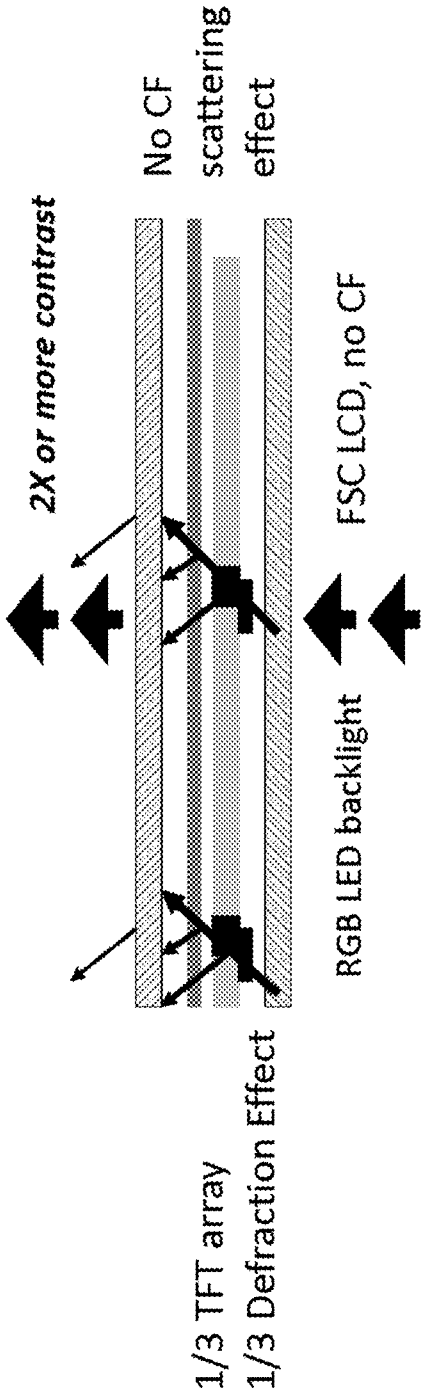
FIG. 12B illustrates that removing the Color Filter and two thirds of the Column Drivers reduces the scattering, thus increasing the contrast by 2×-3×.

FIG. 12B illustrates that the contrast will be increased by 2×-3× because the color filters and ⅔ of the column drivers are removed, which reduces the scattering of light.

FIG. 13 illustrates a traditional ΔΣ block diagram for building audio compact discs (CDs).

Figure 14:
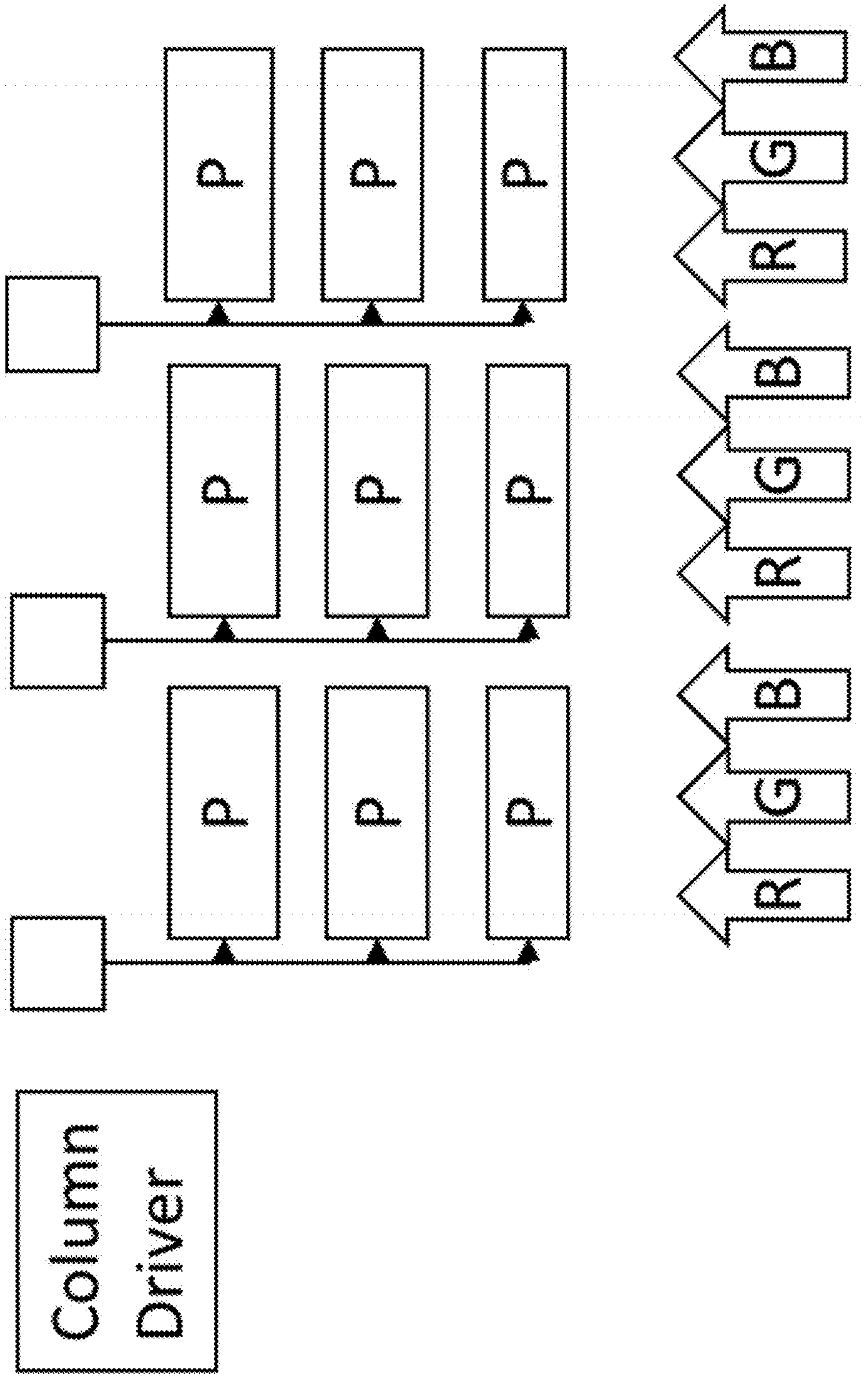
FIG. 14 illustrates how a column driver turns on the pixels for an entire column. The TCON or AP choses the appropriate value. The column driver does the work to turn on the TFTs.

FIG. 14, sets the required voltage of the pixels in the activated row and thus supplies voltages to the LCD panel. The column driver turns on RGB pixel per row. The pixel shows Red/Green/Blue at the same time, but PPI is less as three subpixels make up a pixel in the RGB case.

Figure 15:
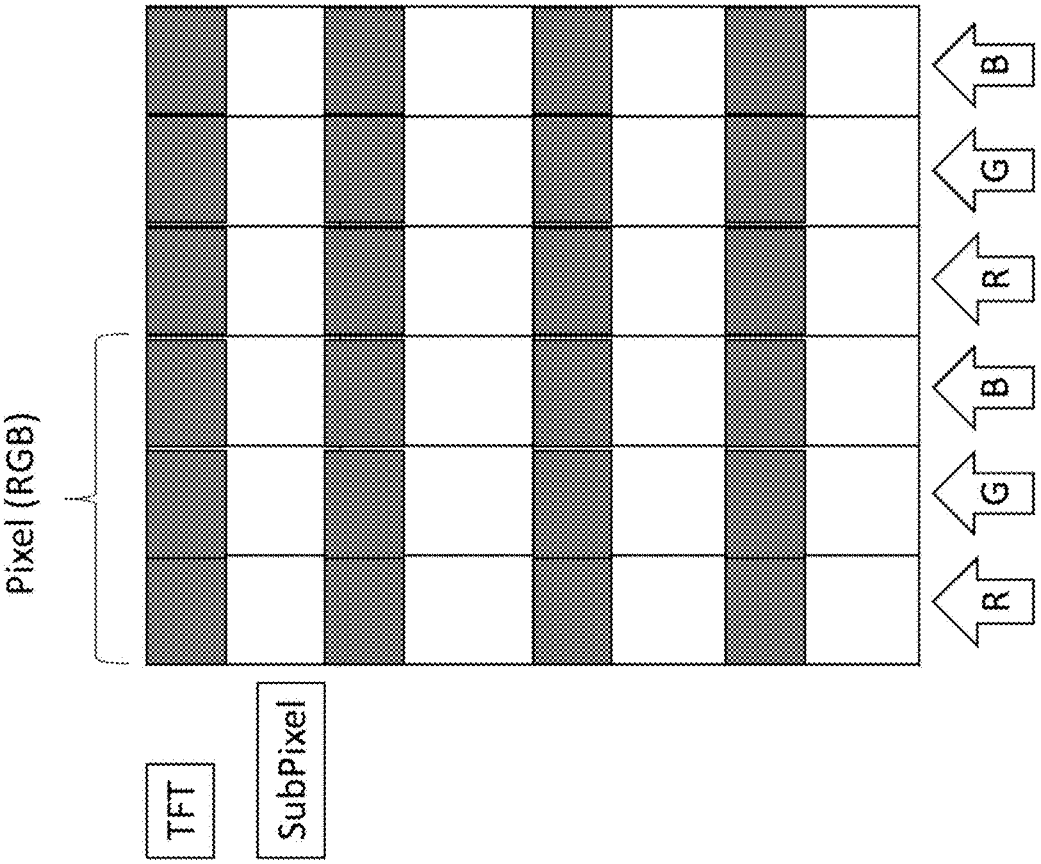
FIG. 15 illustrates that the TFT sits within the pixel. TFT blocks the available light which reduces the aperture ratio. Making the TFT smaller increases the aperture ratio.

FIG. 15 shows an LCD panel comprises a matrix of pixels, divided into for example, red, green, and blue "subpixels". In FIG. 15, the grey is the TFT which is mainly opaque (blocks light). The more transistors and capacitors equals more light blocked. The subpixel is Red Green or Blue. The pixel is the a group of three (if RGB). The column driver turns on a pixel (RGB). For 1080P, this means there are 1920*1080*3=6 Million pixels to turn on. For the disclosed invention of FSC, it is Red or Green or Blue, which means only 1920*1080=2 Million Pixels have to be turn on.

I claim:

1. An image processing system comprising an oversampling module and a sequential color picker, wherein the oversampling module is configured to convert an N bits-per-component image or video to an M bits-per-component image or video using an oversampling frequency, wherein the oversampling frequency is a ratio of an incoming video frequency and a refresh frequency of a display; and wherein the sequential color picker is configured to segment M bits-per-component frames outputted from the oversampling module to output frames each having a single color.

2. The image processing system of claim 1, wherein the N bits-per-component image or video is displayed on the display over time after being converted to the M bits-per-component image or video.

3. The image processing system of claim 1, wherein the N bits-per-component image or video displays High Dynamic Range (HDR) content and M bits-per-component at a frequency F2 creates an equivalent to image or video having N bits-per-component at a frequency F1 wherein N bits-per-component at the frequency F2 is not possible to achieve due to display driver constraints.

4. The image processing system of claim 1, wherein a reduced power display is created by setting the M bits to be less than or equal to the N bits and displaying a Field Sequential Color (FSC) image or video.

5. The image processing system of claim 1, wherein at least one of a brightness, a contrast, and a Pixel Per Inch (PPI) of the display is increased by setting M is less than or equal to N and creating an equivalent image to an image having N bits-per-component and displaying a Field Sequential Color (FSC) image or video.

6. The image processing system of claim 1, wherein a Color Breakup (CBU) of the display is reduced by setting M is less than or equal to N and creating an equivalent image to an image having N bits-per-component and displaying a Field Sequential Color (FSC) image or video.

7. The image processing system of claim 1, wherein the display or a Field Sequential Color (FSC) stack for the display is devoid of any color filter.

8. The image processing system of claim 7, wherein the display is a liquid crystal display.

9. The image processing system of claim 7, further comprising a column driver controlling colors separately.

10. The image processing system of claim 1, further comprising at least one Blue LED, wherein the at least one Blue LED has a wavelength being greater than 455 nm.

11. The image processing system of claim 1, wherein an M bits-per-component at a frequency F2 is greater than or equal to three times a harmonic of a motion of a video.

* * * * *